(12) United States Patent
Light

(10) Patent No.: US 7,696,439 B2
(45) Date of Patent: Apr. 13, 2010

(54) LAYERED METAL STRUCTURE FOR INTERCONNECT ELEMENT

(75) Inventor: David Light, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 11/801,336

(22) Filed: May 9, 2007

(65) Prior Publication Data

US 2008/0093108 A1    Apr. 24, 2008

Related U.S. Application Data

(60) Provisional application No. 60/801,171, filed on May 17, 2006, provisional application No. 60/801,944, filed on May 18, 2006.

(51) Int. Cl.
*H01B 7/18*    (2006.01)
*H05K 1/00*    (2006.01)

(52) U.S. Cl. .................................. 174/117 FF; 174/250

(58) Field of Classification Search ............ 174/117 FF, 174/250, 255
See application file for complete search history.

(56) References Cited

U.S. PATENT DOCUMENTS 3,489,656 A * 1/1970 Balde .......................... 205/125
3,801,388 A * 4/1974 Akiyama et al. ............... 216/20
6,459,041 B1 * 10/2002 Achari et al. ............ 174/117 F
2003/0136578 A1 * 7/2003 Kishimoto et al. .......... 174/255
2003/0226687 A1 * 12/2003 Kataoka et al. ............. 174/250
2007/0023019 A1 * 2/2007 Hamada et al. ............. 123/634

* cited by examiner

*Primary Examiner*—Chau N Nguyen
(74) *Attorney, Agent, or Firm*—Lerner, David, Littenberg, Krumholz & Mentlik, LLP

(57) ABSTRACT

A layered metal structure is provided in accordance with an aspect of the invention. The structure can be used, for example, to fabricate a conductive interconnect element for conductively interconnecting one or more microelectronic elements. The layered structure includes first and second metal layers each of which may include one or more of copper or aluminum, for example. An intervening layer, may include for example, chromium between the first and second metal layers, chromium being resistant to an etchant usable to pattern the first and second metal layers selectively to the intervening layer. An etchant such as cupric chloride, ferric chloride ($FeCl_3$), a peroxysulfuric composition, or a persulfate composition may be used to pattern the first and second metal layers in such case.

11 Claims, 3 Drawing Sheets

LAYERED METAL STRUCTURE FOR INTERCONNECT ELEMENT

CROSS-REFERENCE TO RELATED APPLICATION

This application claims the benefit of the filing dates of the following U.S. Provisional Applications: 60/801,171 filed May 17, 2006 and 60/801,944 filed May 18, 2006. Said U.S. Provisional Applications are incorporated herein by reference.

FIELD OF THE INVENTION

The present invention relates to interconnect elements such as wiring circuit panels and package elements which include metal wiring patterns, for example, as used for providing circuit interconnections and for providing interconnections within or between packaged microelectronic devices or other devices.

BACKGROUND OF THE INVENTION

Ways have been described for patterning wiring circuit elements having metal wiring patterns exposed on one side and a plurality of posts or bumps extending from another side opposite to the one side. Typically, the first metal wiring patterns are connected vertically by the posts with second wiring patterns to which the posts are joined later. Usually, a dielectric layer is provided overlying the first metal wiring patterns as an insulating layer between the first and second wiring patterns.

One known way of fabricating the first metal patterns and conductively connected posts is to pattern them from a layered metal structure that includes an inner layer consisting essentially of nickel sandwiched, i.e., disposed between first and second layers of copper. The nickel layer functions as an etch stop layer when the first and second copper layers are patterned, such that each of the first and second copper layers can be patterned in accordance with different masking layers.

However, there are problems associated with this method. One problem is that nickel is attacked by cupric chloride ($CuCl_2$), an etchant which is commonly used for patterning features from a copper layer. In order to address this problem, an ammoniacal etchant can be used to pattern the copper layers. Sometimes, a cupric chloride containing etchant is used to pattern a portion of the thickness of a copper layer, when contact between the etchant and the nickel layer can be avoided. Subsequently, an ammoniacal etchant is applied to finish etching through the thickness of the copper layer, stopping on the nickel etch stop layer.

Ammoniacal etchants are not as not as commonly used as cupric chloride, and processes using such etchants typically are more difficult to control than those in which cupric chloride is used.

Another concern is that nickel forms a relatively porous layer when deposited, whether deposited by vapor deposition, e.g., sputtering or chemical vapor deposition, or by electroplating. Because of this, the nickel layer needs to be sufficiently thick to avoid the emergence of pinholes which extend through the thickness of the nickel layer. Typically, the thickness of a nickel layer provided as an etch stop layer between first and second copper layers is about 5 microns. The relatively large thickness of the nickel layer requires that a corresponding etchant quantity and time need to be expended during subsequent processing to remove unwanted portions of the nickel layer after the copper layers have been patterned.

SUMMARY OF THE INVENTION

A layered metal structure is provided in accordance with an aspect of the invention. The structure can be used, for example, to fabricate a conductive interconnect element for conductively interconnecting one or more microelectronic elements. The layered structure includes first and second metal layers each including copper and an intervening layer between the first and second metal layers which is resistant to an etchant usable to pattern the first and second metal layers selectively to the intervening layer.

For example, a layered metal structure can be provided which includes first and second metal layers each including at least one of copper and aluminum and an intervening layer, including for example, chromium between the first and second metal layers which is resistant to an etchant usable to pattern the first and second metal layers selectively to the intervening layer. An etchant such as cupric chloride, ferric chloride ($FeCl_3$), a peroxysulfuric composition, or a persulfate composition may be used in such case.

The layered metal structure may include one or more metals or one or more alloys of metals selected from the group consisting of: aluminum (Al), chromium (Cr), tantalum (Ta), titanium (Ti), titanium-tungsten (Ti—W), tungsten (W), molybdenum (Mo), nickel-chromium (NiCr), nickel-vanadium (NiV), gold (Au), silver (Ag), platinum (Pt) and palladium (Pd), or the intervening layer includes at least one of titanium nitride (TiN) or tantalum nitride (TaN).

The etchant to which the intervening layer is resistant may include cupric chloride. The intervening layer may include, for example, one or more metals selected from the group consisting of chromium and an alloy of chromium and nickel.

In one example, the etchant can include at least one composition selected from the group consisting of cupric chloride ($CuCl_2$), ferric chloride ($FeCl_3$), a peroxysulfuric composition, and a persulfate composition.

In a particular example, the intervening layer may include a layer consisting essentially of chromium and the etchant may include a composition selected from cupric chloride ($CuCl_2$), ferric chloride ($FeCl_3$), a peroxysulfuric composition, and a persulfate composition.

In one example, the intervening layer may include aluminum and the etchant includes at least one composition selected from the group consisting of a peroxysulfuric composition and a persulfate composition.

In yet another example, the intervening layer may include at least one of tantalum or tantalum nitride and the etchant includes ferric chloride.

In one embodiment, the first and second metal layers are not attacked by an etchant which attacks the intervening layer.

The intervening layer may consist essentially of chromium. In such event, the intervening layer consisting essentially of chromium may have a thickness ranging from a few tens of angstroms and up.

In one embodiment, the etchant may include one or more ov cupric chloride, ferric chloride, a peroxysulfuric composition or a persulfate composition.

In a particular example, the intervening layer may include tungsten and the etchant include ferric chloride.

In another particular example, the intervening layer may include chromium and nickel and the etchant may include cupric chloride. In one or more of the above examples, at least one of first and second metal layers may an electrodeposited copper foil or a rolled annealed copper foil.

In accordance with another aspect of the invention, a method is provided for fabricating an interconnect element. In accordance with such method, a layered metal structure is provided which includes first and second metal layers each including copper. An intervening layer can be disposed between the first and second metal layers. The intervening layer may be deposited by sputtering or electroplating, for example. The first metal layer can then be patterned using an etchant which attacks the first metal layer and does not attack the intervening layer. The second metal layer can be patterned using an etchant which attacks the second metal layer and does not attack the intervening layer.

In one example, portions of the intervening layer exposed by the patterning of the first and second metal layers are removed. Such removal can be performed, for example, by etching using an etchant which does not attack the first and second metal layers.

In a particular example, the step of providing the layered metal structure may include depositing the intervening layer onto a face of the first metal layer including copper. A second metal layer including copper may then be formed on an exposed face of the intervening layer to form the layered metal structure.

In one embodiment, the step of patterning the first metal layer includes photolithographically patterning a layer of photo-imageable material overlying the first metal layer prior to applying the etchant to the first metal layer.

In a particular embodiment, the step of patterning the first metal layer forms a plurality of metal wiring patterns overlying the intervening layer and exposes the intervening layer between ones of the plurality of metal wiring patterns.

In one example, the second metal layer may form a plurality of metal posts overlying the intervening layer and expose the intervening layer between ones of the plurality of metal posts.

In a particular embodiment, a plurality of metal wiring patterns overlying the intervening layer may be form from the first metal layer. The intervening layer may be exposed between ones of the plurality of metal wiring patterns. When patterning the second metal layer, a plurality of metal posts may be formed which overlie the intervening layer and expose the intervening layer between ones of the plurality of metal posts.

The intervening layer may consist essentially of at least one of chromium or aluminum, for example. In such case, steps of patterning the first metal layer and patterning the second metal layer may be performed using an etchant including at least one of cupric chloride ($CuCl_2$), ferric chloride ($FeCl_3$), a peroxysulfuric composition, or a persulfate composition. A step of removing exposed portions of the intervening layer may be performed using an etchant which includes an alkaline permanganate.

DETAILED DESCRIPTION

In view of the foregoing described problems, a layered metal structure is provided in accordance with an embodiment of the invention which includes first and second layers each of which includes copper and an intervening layer including chromium disposed between the first and second layers of copper. Preferably, the first and second layers consist essentially of copper and the intervening layer consists essentially of chromium. Chromium is not attacked by an etchant which includes cupric chloride ($CuCl_2$), such as commonly used to pattern features from a layer of copper. Therefore, the intervening layer of chromium can be used as an etch stop layer when patterning the first and second copper layers of the layered metal structure with an etchant including cupric chloride. In addition, a layer of chromium, as deposited typically by sputtering or electrodeposition, e.g., electroplating, is not as porous as nickel, such that the layer of chromium functions adequately as an etch stop layer for copper etching processes when its thickness is about one micron. This compares to a thickness of about five microns believed necessary when the etch stop layer consists of nickel.

Figure 1:
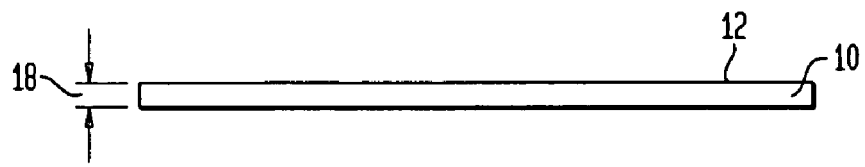
FIGS. 1 through 3B are sectional views illustrating stages in a method of fabricating a layered metal structure in accordance with an embodiment of the invention.

A method of making a layered metal structure according to a first embodiment of the invention will now be described with reference to FIGS. 1 through 3. As illustrated in FIG. 1, a layer or foil 10 is provided which consists at least essentially of copper; i.e., the layer consists of copper or consists essentially of copper. The copper layer 10 preferably is provided by a process which includes electrodeposition, in which case the layer can be referred to as an "electrodeposited foil". Preferably, the thickness 18 of the copper layer is from about 1 micron to about 100 microns. In a particular example, the thickness is about 50 microns or less; in another example, the thickness is only a few microns. When the copper layer 10 is very thin, i.e., close to 1 micron in thickness, the copper layer may be formed, for example, by electroplating or a combination of electroless plating and electroplating onto a surface of a carrier from which the copper layer 10 can be released after fabrication of the layered metal structure.

Figure 2:

As illustrated in FIG. 2, an intervening layer 14 including chromium, and which preferably consists essentially of chromium, is formed on the major surface 12 of the copper layer 10. In one example, such chromium layer 14 is formed by sputtering or other vapor deposition method. In another example, the chromium layer is formed by electroplating. In a particular embodiment, the chromium layer has a thickness from about a few tens of angstroms or greater. In one embodiment, the thickness of the intervening layer is about 1 micron, measured from the major surface 12 of the copper foil 10 on which it is formed. The thickness of the intervening layer can usually be made smaller when the chromium is deposited by sputtering rather than by electroplating.

Figure 3A:
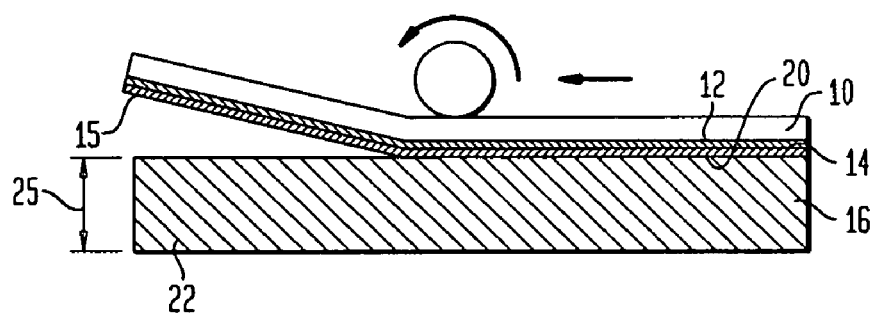
Figure 3B:
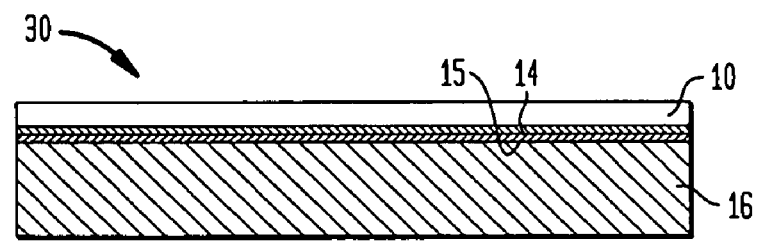

After forming the chromium layer 14, processing is now performed to join the first copper layer 10 to a second copper layer or foil 16 (FIG. 3A), with the chromium layer 14 disposed between the two copper layers. Specifically, the chromium layer 14 is sandwiched between the major surface 12 of the first copper layer 10 and a major surface 20 of the second copper layer 16 which confronts the surface 12 of the first copper layer. In one embodiment, a layer 15 including copper, nickel or at least one of copper or nickel is deposited onto the chromium layer 14 as a seed layer for promoting adhesion and conductivity. Thereafter, the first copper layer 10 with the chromium layer 14 and seed layer 15 thereon is joined to a second copper layer 16 by roll lamination, as illustrated in FIG. 3A.

The second copper foil 16 can be an electrodeposited foil or can be provided by a process which relies on rolling and annealing, in which case the copper foil 16 is referred to as a "rolled annealed" foil. The second copper foil 16 preferably has a thickness sufficient for defining posts of an interconnect element therefrom by subtractively etching the copper foil. As the subsequently defined posts can vary in height depending upon the application in which they will be used, the thickness 25 of the copper foil 16, measured between a first major surface 20 confronting the chromium layer 14 and seed layer 15 to a second major surface 22, preferably is between about 10 microns and 200 microns.

In such manner, a layered metal structure 30 (FIG. 3B) is provided which includes first and second copper layers 10, 16 between which an intervening layer 14 including chromium is provided. The intervening layer including chromium is suitable for use an etch stop layer when patterning either one or both of the copper layers 10, 16 with an etchant that includes cupric chloride.

Figure 4:
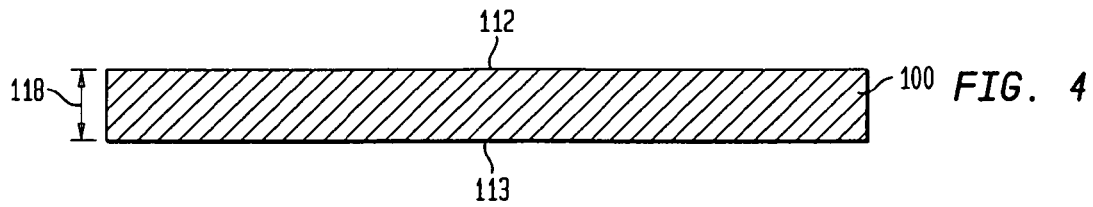
FIGS. 4 through 6 are sectional views illustrating stages in a method of fabricating a layered metal structure in accordance with another embodiment of the invention.
Figure 5:
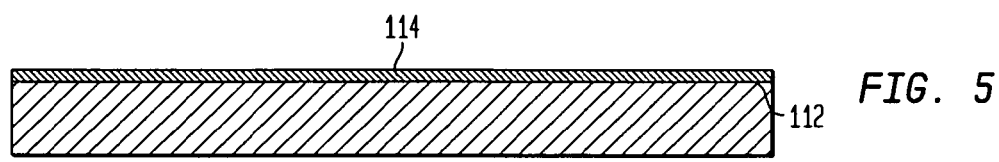
Figure 6:
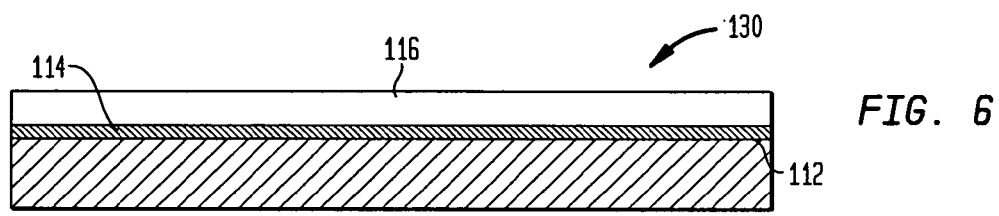

In another embodiment illustrated with respect to FIGS. 4-6, a layered metal structure is provided having first and second copper layers and an intervening layer including chromium. Such process begins with foil 100 including copper, the foil 100 preferably consisting at least essentially of copper. In one example, the copper foil 100 is an electrodeposited foil. Alternatively, the copper foil 100 can be a rolled annealed foil. The copper foil 100 preferably has a thickness sufficient for defining posts of an interconnect element therefrom by subtractively etching the copper foil. As the subsequently defined posts can vary in height depending upon the application in which they will be used, the thickness 118 of the copper foil 100, measured between a first exposed major surface 112 and a second exposed major surface 113, preferably is between about 10 microns and 200 microns.

Referring to FIG. 5, a layer including chromium 114 (hereinafter, "chromium layer" 114) is deposited onto copper foil 100. Preferably, the chromium layer consists at least essentially of chromium. Preferably the thickness of the resulting chromium layer is about one micron. Preferably, the chromium layer is deposited, for example, by sputtering, other vapor deposition method or by electroplating. Following the deposition of the chromium layer, an optional seed layer (not shown) of copper preferably is deposited.

Following the formation of the chromium layer and the optional seed layer, a second layer 116 of copper can be blanket deposited onto the chromium 114 layer to form the layered metal structure 130 illustrated in FIG. 6. Preferably, the second layer is deposited by sputtering or other vapor deposition technique, or otherwise, by electroplating. The second layer preferably has a thickness of between about 1 micron and 100 microns. In a particular example, the thickness is about 50 microns or less; in another example, the thickness is only a few microns. From the second layer 116, a set of wiring patterns can be formed by subtractive etching, such as will be described with reference to FIGS. 10-11 below.

Figure 7:
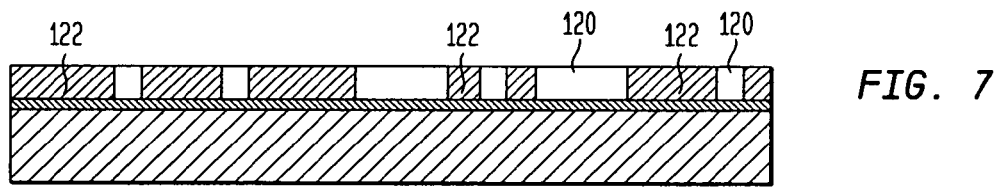
FIG. 7 is a sectional view illustrating a variation of the embodiment illustrated in FIGS. 4 through 6.

Alternatively, as illustrated in FIG. 7, a masking layer 120, such as a photolithographically patterned photoresist layer can be provided on the exposed surface of the chromium layer 114 and/or optional seed layer, the masking layer 120 including openings which expose the chromium layer 114 and/or seed layer. Thereafter, copper features 122 are plated within the openings of the masking layer. Subsequent planarization techniques, such as etching back, polishing, grinding or chemical mechanical polishing can be applied to planarized the copper features 122 and, if needed, to separate the copper features from each other. Thereafter, the masking layer 120 can be removed, leaving the copper features 122 as wiring patterns exposed at a surface of the layered metal structure.

Figure 8:
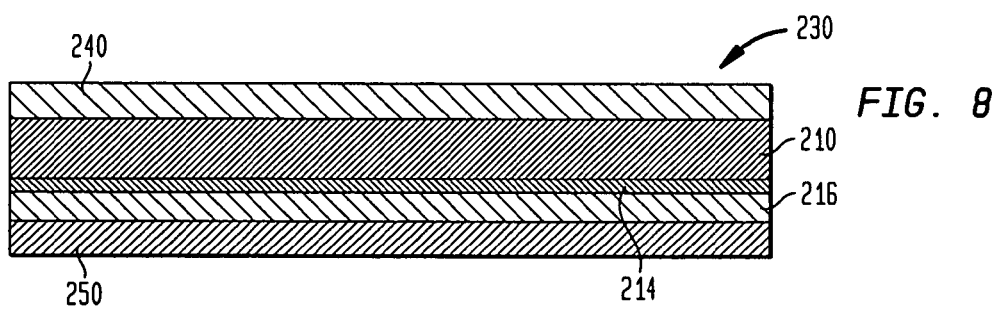
FIGS. 8 through 12 are sectional views illustrating stages in a method of fabricating an interconnect element in accordance with an embodiment of the invention.

A method of fabricating an interconnect element will now be described, with reference to FIGS. 8-12. As illustrated in FIG. 8, a layered metal structure 230 is provided having a first relatively thick layer 210 including copper (hereinafter, "first copper layer") and a second layer 216 including copper (hereinafter, "second copper layer"), separated from the first layer 210 by an intervening layer 214 which includes chromium. Preferably, the first and second copper layers consist essentially of copper and the intervening layer 214 includes a layer which consists essentially of chromium. Preferably, the thickness of the first copper layer is between about 10 and 200 microns. In a particular example, the thickness is between about 50 and 125 microns; in still another example, the thickness is about 10 microns. The thickness of the second copper layer is between about one micron and 100 microns. In a particular example, the thickness is between 1 micron and 50 microns; in still another example, the thickness is a few (less than 10) microns. In a particular example, the thickness of the chromium layer is about one micron. As further illustrated in FIG. 8, masking layers 240 and 250 are disposed on major surfaces of the first and second copper layers 210, 216, respectively. In one example, the masking layers 240, 250 include a photoimageable material such as a photoresist.

Figure 9:
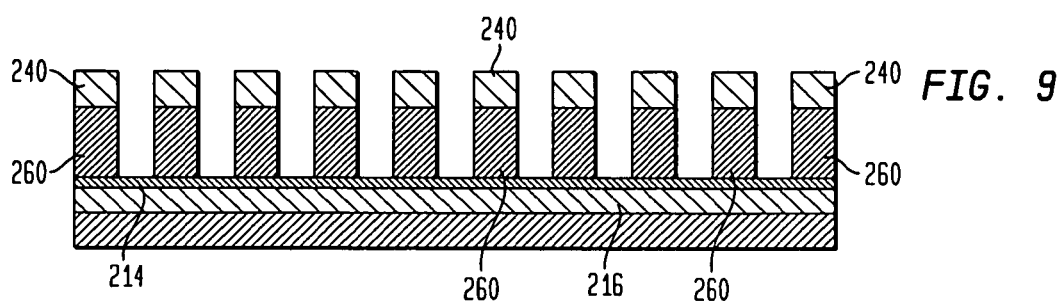

As illustrated in FIG. 9, the masking layer 240 is patterned, e.g., by photolithography, after which the first copper layer 210 is patterned by etching to form a plurality of posts 260 extending above the chromium layer 214. Preferably, the first copper layer 210 is patterned using an etchant which includes cupric chloride ($CuCl_2$). Cupric chloride does not attack chromium. Therefore, the chromium layer 214 remains in place and functions as an etch stop layer to keep the cupric chloride etchant from attacking the second copper layer 216.

Figure 10:
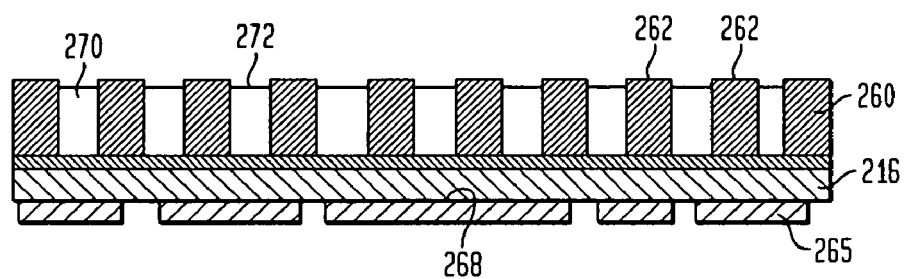

FIG. 10 illustrates a further stage in the fabrication of an interconnect element in which a dielectric layer 270 is provided as an insulating layer or masking layer between individual posts 260. In a particular embodiment (not shown), the dielectric layer 270 at this point in processing covers the tips 262 of the posts. Such dielectric layer 270 can be formed, for example, by applying a liquid insulating material such as a spin-on organic or inorganic dielectric. Alternatively, the dielectric layer 270 can be formed by pressing the patterned layered structure with the tips 262 of the posts 260 facing a dielectric structure, preferably under application of heat until the tips 262 are exposed above the major surface 272 of the dielectric layer 270.

Figure 11:
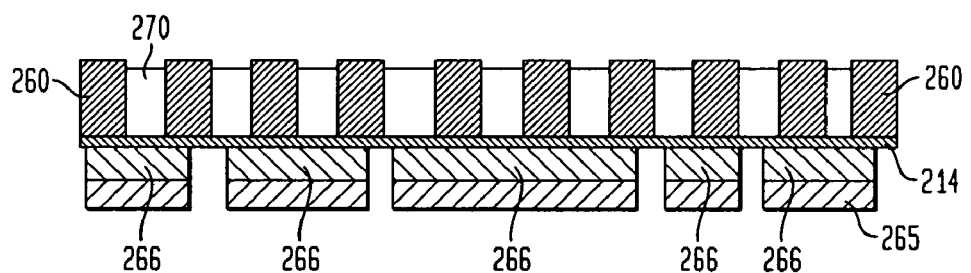

Thereafter, a patterned masking layer 265 is formed to overlie a major surface 268 of the second copper layer 216. Then, as illustrated in FIG. 11, the second copper layer 216 is patterned in accordance with the patterned masking layer 265 to form wiring patterns 266. As in the above-described process of patterning the first copper layer, the second copper layer is patterned with an etchant including cupric chloride that etches through the full thickness of the second copper layer, stopping on the chromium layer 214. At the conclusion of this step, the chromium layer remains between the posts 260 and the wiring patterns.

Figure 12:
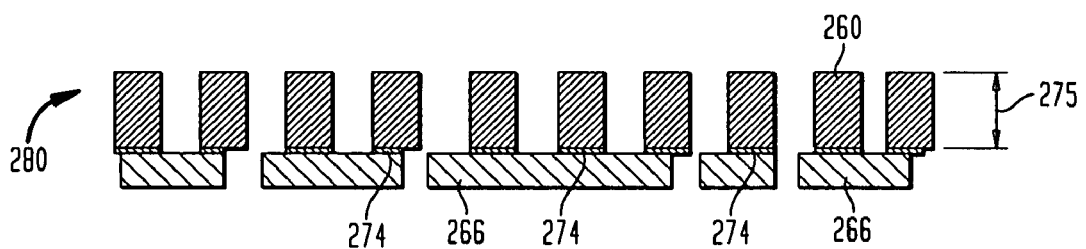

Subsequently, as illustrated in FIG. 12, the masking layer 265 (FIG. 11) is removed and optionally, dielectric layer 270 (FIG. 11) is removed. Unwanted portions of the chromium layer that are exposed in openings between the wiring patterns are also removed, as by etching using an etchant which attacks chromium but does not attack copper. An etchant which includes an alkaline permanganate is suitable for this purpose, among others. In such manner, posts 260 and wiring patterns 266 are now no longer shorted together by way of the chromium layer. Portions 274 of the chromium layer remain only in certain places. Specifically, the portions 274 remain in places where posts 260 and wiring patterns 266 are conductively connected in a vertical direction 275, i.e., in the direction of a height of the posts 260 above the wiring patterns 266.

The following chart lists metals and materials in addition to chromium, in which one or more of such metals or materials are suitable for use in an intervening layer of the layered metal structure. In each case, the metal or material listed in the leftmost column of the chart is resistant to an etchant which is usable to pattern one or more of the first and second copper metal layers of a layered metal structure. Various etchant compositions are indicated at the headings of each of the columns to the right of the leftmost column. Etchant compositions can include among others, proprietary etchants which are manufactured and sold by a variety of etch process vendors, as well as cupric chloride ($CuCl_2$), ferric chloride ($FeCl_3$), peroxysulfuric compositions, persulfate compositions (typically ammonium persulfate compositions) and ceric ammonium nitrate.

TABLE 1

| Intervening Layer Material | Etchant | | | | | |
|---|---|---|---|---|---|---|
| | Proprietary | CuCl2 | FeCl3 | Peroxysulfuric | Persulfate | Ceric Ammonium Nitrate |
| Cr | R | R | R | R | R (ammonium) | |
| Al | R | Moderate | R (very slow) | R | R (ammonium) | |
| Ni | | | | | R | |
| Ti | R | | | | | R |
| TiN | R | | | | | R |
| Ti—W | R | | | | | R |
| Ta | R | R | R | | R | R |
| TaN | R | R | R | | R | R |
| W | R | | R | | | |
| Mo | R | | | | | |
| NiCr | R | R | | | | |
| Ni—V | R | | | | | |
| Au | R | R | R | R | R | |
| Ag | R | R | R | R | R | |
| Pt | R | R | R | R | R | |
| Pd | R | R | R | R | R | |

In some cases, the intervening layer can include a resistive material such as nickel-chromium (NiCr). Because of this property, the resistive intervening layer can be patterned at a stage of fabrication after that shown in FIG. 11 to provide resistive features within the interconnect element. However, such nickel-chromium layer provides good conductivity between the posts 260 and the conductive wiring patterns because in such case, the small thickness of the nickel-chromium layer is not sufficient to produce resistance that impacts the conductivity or performance of those connections.

After producing the structure 280 shown in FIG. 12, one or more dielectric layers and/or additional wiring pattern layers can be added to the structure, if desired. The following numbered paragraphs describe various features and combinations in accordance with embodiments of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnect element for conductively interconnecting one or more microelectronic elements, comprising:
   a dielectric layer;
   a plurality of wiring patterns consisting essentially of copper and extending along a surface of said dielectric layer;
   a plurality of conductive posts having first ends adjacent to said wiring patterns and second ends remote therefrom;
   an etch stop layer consisting essentially of chromium or an alloy of chromium and nickel electrically connecting said first ends of said posts with said wiring patterns, said etch stop layer being resistant to an etchant usable to pattern each of first and second metal layers in accordance with first and second masks, respectively, to form said posts and said wiring patterns, respectively, wherein said etchant includes cupric chloride, wherein lengths of said posts between said first and second ends are much greater than a thickness of said etch stop layer between said posts and said wiring patterns.

2. The layered metal structure as claimed in claim 1, wherein said etch stop layer consists essentially of chromium and said etch stop layer has a thickness of only about a few tens of angstroms.

3. The layered metal structure as claimed in claim 1, wherein at least one of the plurality of wiring patterns or the plurality of posts includes electrodeposited copper.

4. The layered metal structure as claimed in claim 1, wherein at least one of the plurality of wiring patterns or the plurality of posts includes rolled annealed copper.

5. An interconnection element as claimed in claim 1, wherein said plurality of posts have lengths of at least 10 microns and said etch stop layer has a thickness smaller than 10 microns.

6. An interconnection element as claimed in claim 5, wherein said thickness of said etch stop layer is about 1 micron.

7. An interconnect element for conductively interconnecting one or more microelectronic elements, comprising:
   a dielectric layer;
   a plurality of wiring patterns including copper and extending along a surface of said dielectric layer;
   a plurality of conductive posts including copper having first ends adjacent to said wiring patterns and second ends remote therefrom;
   an etch stop layer consisting essentially of chromium or an alloy of chromium and nickel electrically connecting said first ends of said posts with said wiring patterns, said etch stop layer being resistant to an etchant usable to pattern each of first and second metal layers in accordance with first and second masks, respectively, to form said posts and said wiring patterns, respectively, wherein said etchant includes at least one composition selected from the group consisting of ferric chloride ($FeCl_3$), a peroxysulfuric composition, and a persulfate composition, wherein lengths of said posts between said first and second ends are much greater than a thickness of said etch stop layer between said posts and said wiring patterns.

8. The layered metal structure as claimed in claim 7, wherein said first and second metal layers are not attacked by an etchant which attacks said etch stop layer.

9. The layered metal structure as claimed in claim 7, wherein said etch stop layer consists essentially of an alloy of chromium and nickel.

10. An interconnect element for conductively interconnecting one or more microelectronic elements, comprising:
- a first metal layer consisting essentially of copper and having a thickness of at least 10 microns, said first metal layer including a plurality of posts each having a first end and extending in a first direction therefrom to a second end;
- a dielectric layer extending in second and third directions transverse to said first direction;
- a second metal layer consisting essentially of copper, said second metal layer including a plurality of wiring patterns extending in at least one of said second and third directions along a surface of said dielectric layer;
- an etch stop layer consisting essentially of chromium or an alloy of chromium and nickel and having a thickness up to about one micron, said etch stop layer joining said first ends of said posts with said wiring patterns, said etch stop layer being resistant to an etchant usable to pattern each of said first and second metal layers in accordance with first and second masks, respectively, to form said posts and said wiring patterns, respectively, wherein said etchant includes cupric chloride.

11. An interconnect element for conductively interconnecting one or more microelectronic elements, comprising:
- a first metal layer consisting essentially of copper and having a thickness of at least 10 microns, said first metal layer including a plurality of posts each having a first end and extending in a first direction therefrom to a second end;
- a dielectric layer extending in second and third directions transverse to said first direction;
- a second metal layer consisting essentially of copper, said second metal layer including a plurality of wiring patterns extending in at least one of said second and third directions along a surface of said dielectric layer;
- an etch stop layer consisting essentially of chromium or an alloy of chromium and nickel and having a thickness up to about one micron, said etch stop layer joining said first ends of said posts with said wiring patterns, said etch stop layer being resistant to an etchant usable to pattern each of said first and second metal layers in accordance with first and second masks, respectively, to form said posts and said wiring patterns, respectively, wherein said etchant includes at least one composition selected from the group consisting of ferric chloride ($FeCl_3$), a peroxysulfuric composition, and a persulfate composition.

* * * * *